United States Patent
Hidaka

(10) Patent No.: US 7,234,965 B2
(45) Date of Patent: Jun. 26, 2007

(54) WIRING STRUCTURE USING FLEXIBLE PRINTED CIRCUIT BOARD AND OPTICAL MODULE USING THE SAME

(75) Inventor: Hirotoshi Hidaka, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/219,800

(22) Filed: Sep. 7, 2005

(65) Prior Publication Data

US 2007/0054517 A1   Mar. 8, 2007

(51) Int. Cl.
*H01R 12/24* (2006.01)

(52) U.S. Cl. ...................................... 439/493

(58) Field of Classification Search ................. 439/67, 439/77, 492, 493
See application file for complete search history.

(56) References Cited

U.S. PATENT DOCUMENTS 6,419,501 B1 * 7/2002 Okabe et al. .................. 439/77

FOREIGN PATENT DOCUMENTS

| JP | 06-326425 | 11/1994 |
|----|-----------|---------|
| JP | 11-195855 | 7/1999 |
| JP | 2001-305568 | 10/2001 |

* cited by examiner

*Primary Examiner*—Tho D. Ta
*Assistant Examiner*—Vanessa Girardi
(74) *Attorney, Agent, or Firm*—Venable LLP; Michael A. Sartori; Steven J. Schwarz

(57) ABSTRACT

The present invention prevents the wiring pattern formed on the FPC board with the support board from being damaged or broken by the edge of the support board when the FPC board is bent at the edge portion of the support board. According to the invention, the FPC board, provides the wiring pattern on at least one surface and is stuck with the support board on the surface where the wiring pattern is formed. The support board of the invention has a clipped portion in the edge along which the FPC board is bent and the wiring pattern on the FPC board passes this clipped portion.

9 Claims, 3 Drawing Sheets

WIRING STRUCTURE USING FLEXIBLE PRINTED CIRCUIT BOARD AND OPTICAL MODULE USING THE SAME

BACKGROUND OF THE INVENTION

1. Field of the Invention

The present invention relates to a wiring structure using a flexible printed circuit board (hereinafter denoted as FPC board) and an optical module using the FPC board. In particular, the invention relates to a configuration of a FPC board with a stiff support and an optical module using the FPC board with the stiff support.

2. Related Prior Art

The FPC board is a freely bendable printed circuit board that provides a polymide base with a thickness of about 12.5 micron meters to 100 micron meters as a core material. Although it is bendable due to the thin core material, it tends to snap wiring patterns made of copper foil and formed on the surface thereof. Various support boards are generally used to prevent the wiring pattern from breaking. The support board can hold a portion of the FPC board in flat. However, when the FPC board is bent at the edge portion of the support board, the problem to break the wiring pattern may occur at such edge portion of the support board.

FIG. 4 shows how the wiring pattern on the FPC board is broken at the edge portion of the support board glued to the FPC board. FIG. 4A is a perspective view of the FPC board 101 with the support board 103, while FIG. 4B is a cross section taken along the line B-B shown in FIG. 4A. In figures, a member 101 is the FPC board made of, for example, polymide, a member 102 is a wiring pattern made of copper foil, and a member 103 is a support board made of, for example, glass-epoxy.

As shown in FIG. 4A and FIG. 4B, when the FPC board 101 provides the support board 103 in a side, the direction C in FIG. 4B, toward which the FPC board is to be bent by almost right angle, the edge of the support board 103, which is made of hard material, may damage or break the wiring pattern 102, though the support board 102 makes the FPC board 101 flat at the portion where the board 103 is stuck with.

The support board 103 to flatten a portion of the FPC board 101 may be often made of glass epoxy with a thickness from 0.3 mm to 1.0 mm, and stuck with the FPC board 101 with an adhesive. The wiring pattern 102 is assumed to foem in the side facing the support board. This configuration is often encountered in the optical subassembly (hereinafter denoted as OSA) connected with a circuit board by the FPC board 101.

FIG. 5 shows such configuration that the OSA 110 has a plurality of lead pins, 114 and 115, connected with the FPC board 111 by passing these lead pins, 114 and 115, into via-holes in the FPC board 111 and soldered to the lands 116 formed in the peripheral of the via-hole and extended from the wiring pattern 112. FIG. 6 is a side view of the OSA 110 with the FPC board shown in FIG. 5, in which the FPC board 111 is bent outwardly by about a right angle. FIG. 7 shows an example of the support board 120 to flatten the portion of the FPC board 111. The support board 120 has a plurality of via-holes, 121 and 122, positions of which correspond to respective positions of via-holes of the FPC board 111 and coincide with the arrangement of the lead pins, 114 and 115. One edge 120a of the support board 120 is a linear shape, while the other edge 120b fits to the outer shape of the OSA 110.

Assuming the arrangement that the wiring pattern 112 is formed on the surface not facing the OSA 110 in FIGS. 5 and 6. Bending the FPC board 111 outwardly to a direction D in FIG. 6, the lands 116 soldered with the lead pin 113 of the OSA 110 may peel off due to the stress caused by the bending of the FPC board 111, which results in the breakage of the wiring pattern. To prevent this failure, the support board 120 shown in FIG. 7 may be stuck to the FPC board 111 from the side E in FIG. 6. Thus, the support board 120 may prevent the lands 116 from peeling off from the FPC board 111. However, when bending the FPC board 111 at the edge portion 120a of the support board 120 with a small radius, typically smaller than 2 mm, the edge portion 120a may damage the wiring pattern 112 on the FPC board 111, which causes the breakage of the wiring pattern 112.

Various techniques are known to prevent the wiring pattern from the breakage by the bending of the FPC board. For example, Japanese Patent Application published as 2001-305568 has one method that a panel, which corresponds to the support board of the present invention, with a hollow at the bent portion of the FPC board, into which a swelling material is filled, promotes a slack bending of the FPC board to protect the breakage the wiring pattern. Another Japanese Patent published as H11-195855 has disclosed a deformation-protecting member made of stiff material, typically made of metal, provided inside the bent portion of the FPC board. Still another Japanese Patent published as H06-326425 has disclosed another method to protect the wiring pattern that the FPC board provides a protective film on the surface thereof and only the edge of this film is fixed to somewhere to prevent the wiring pattern from the damage and the breakage due to the external force.

However, these prior arts may not apply to the case that the FPC board stuck with the support board is bent with a relatively small radius, in particular, they may not apply to the optical subassembly with a small package and dense lead pins.

The present invention is to solve the above subject, namely, the present invention is to provide a wiring structure that, in the FPC board with the support board, when the FPC board is bent at the edge portion of the support board, the wiring pattern formed on the FPC may be not damaged or broken by the edge of the support board.

SUMMARY OF THE INVENTION

One aspect of the present invention relates to a wiring structure that uses a flexible printed circuit board (FPC board) with a support board. The FPC board has first and second regions and at least one surface thereof forms a wiring pattern that extends from the first to second regions. The FPC board is bent with a radius at the boundary of the first and second regions. The support board, which is stuck with the surface of the FPC board in the first region thereof. The wiring structure according to the present invention has a characteristic in that the support board provides a clipped region in one edge portion thereof. The wiring pattern on the FPC board runs within this clipped region when the FPC board is bent along the boundary between the first and second regions.

In the present wiring structure, even the FPC board is bent with a relatively small radius, typically smaller than 2 mm, the edge of the support board may not damage or break the wiring pattern because the wiring pattern runs within in the clipped region of the support board where the edge thereof is removed.

The width of the clipper region is preferably wider than that of the wiring pattern. More particularly, the width of the clipped region may be three times wider than that of the wiring pattern, and the wiring patter runs in the clipped portion substantially the center thereof. Therefore, the gap from the edge of the wiring pattern to the edge of the clipped region becomes substantially equal in both sides of the wiring pattern.

Another aspect of the present invention relates to an optical subassembly (OSA) providing the wiring structure described above. The OSA has a plurality of lead pins, and the wiring structure electrically connects these lead pins to an electronic circuit provided in the outside. The FPC board and the support board have a plurality via-holes, positions of which corresponds to those of the lead pins. The via-holes in the FPC board further provides lands to surround the via-holes and a plurality of wiring patterns each electrically connected to these lands. The lead pins of the OSA are soldered to these lands, after passing through the via-holes of the FPC board and the support board. Thus, the electrical connection between the lead pins and the wiring patterns on the FPC board can be performed.

In the OSA and the wiring structure to the OSA of the present invention, since the support board has a clipped portion where the wiring patterns on the FPC board pass this clipped portion, the edge of the support board can not damage or break the wiring patterns. The clipped portion may correspond to respective wiring patterns independently or one clipped portion may correspond to a group of the wiring patterns altogether.

DESCRIPTION OF PREFERRED EMBODIMENTS

The present invention relates to a flexible printed circuit (hereinafter denoted as FPC) with a support board stuck thereto. By gouging the edge of this support board, the wiring pattern formed in the surface of the FPC board can escape from the breakage caused by the edge of the support board coming in contact to the wiring pattern. Moreover, since no protective member that protect the wiring pattern from the breakage is used, the process tolerance of the FPC board and the support board may be easily controlled, thereby facilitating this wiring structure to apply in the small packaged optical module.

Figure 1:
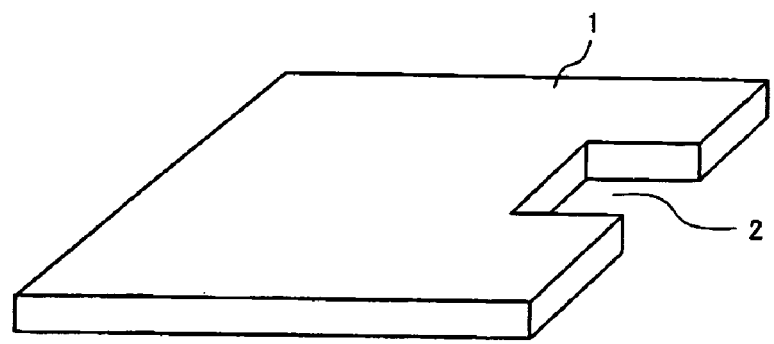
FIG. 1 shows one example of a support board according to the present invention.
Figure 2:
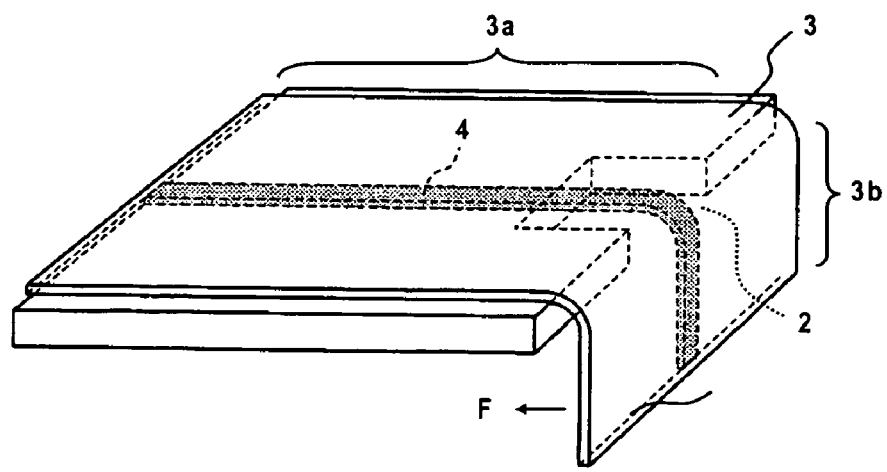
FIG. 2 shows the support board shown in FIG. 1 with a FPC board attached thereto.

FIG. 1 is a perspective view showing one example of the support board 1 with a clipped portion 2 in a center portion of the edge thereof. FIG. 2 shows the support board 1 stuck with an FPC board 3 made of, for example, polymide. The FPC board forms a wiring pattern 4 made of copper foil. The FPC board 3 is stuck with the support board 1 as the wiring pattern 4 faces the support board 1, and is bent at the edge portion of the support board 1 to the direction denoted as the symbol F in the figure by about right angle.

In FIG. 2, the FPC board 3 includes a first region 3a and a second region 3b. The first region 3a is stuck with the support board 1 and the second region 3b is bent by about right angle. The wiring pattern 4 is formed in substantially center of the FPC board to extend from the first region 3a to the second region 3b. The support board 1 is clipped in one edge thereof, along which the FPC board is bent, to correspond to the wiring pattern 4. Since the wiring pattern 4 passes the clipped portion at the edge of the support board without in contact to the edge, the breakage of the wiring pattern 4 at the edge of the support board can be prevented.

The clipped portion 2 of the support board 1 is not restricted to the center portion thereof. The clipped portion 2 is formed in a region where the wiring pattern 4 passes. Moreover, although the clipped portion in this embodiment has a rectangular shape, another shape may be applicable such as triangle, semicircle, and ellipsoid. The width of the clipped portion 2 is wider than a width of the wiring pattern 4. Practically, the width of the clipped portion 2 may be three times wider than that of the wiring pattern 4, and a gap from an edge of the wiring pattern 4 to the edge of the clipped portion is preferably equal in both sides of the wiring pattern 4. The clipped portion 2 formed to correspond to the wiring pattern 4 not to be in contact to the edge of the support board 1 is the condition to perform the present invention.

Moreover, the polymide is used as a base film of the FPC board because of its thermal stability and workability. Some types of the polymide show a thermal expansion coefficient similar to that of the copper foil. Therefore, although the polymide is preferable for the base member of the FPC, the present invention is not restricted to the polymide. The point is that the FPC board is stuck with the support board, bent at the edge of the board and the board has a clipped portion where the wiring pattern formed on the FPC board passes.

Figure 3:
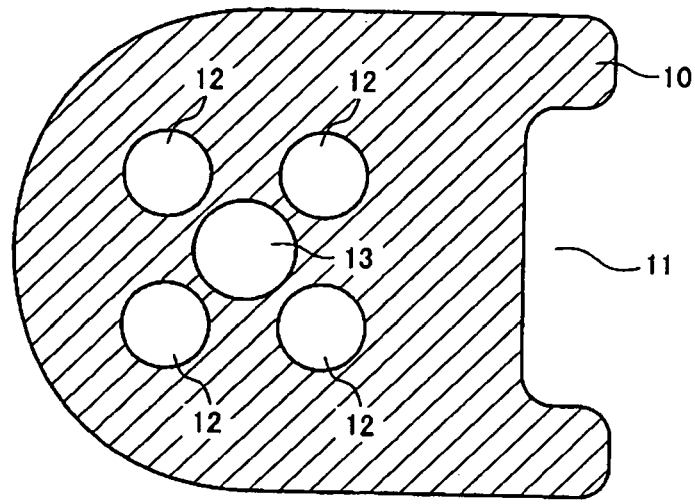
FIG. 3 is another example of the support board of the present invention.
Figure 4A:
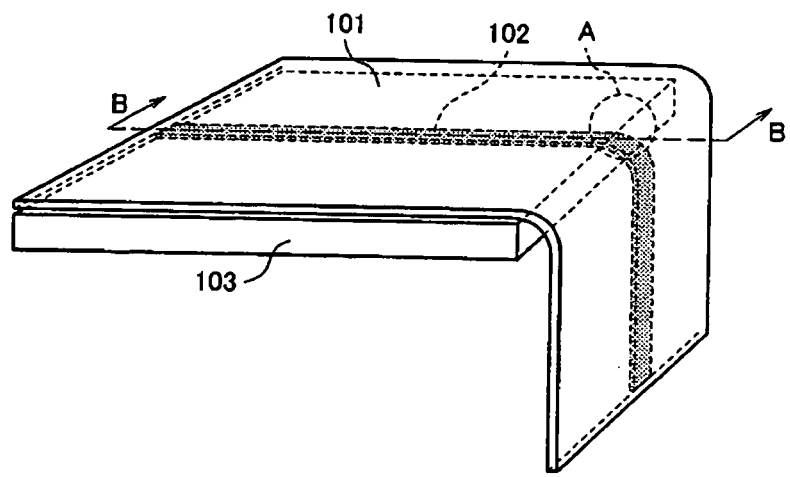
FIG. 4A explains the breakage of the wiring pattern at the edge of the support board with a conventional configuration and FIG. 4B is a cross section of the FPC board with the support board taken along the lone B-B in FIG. 4A.
Figure 4B:
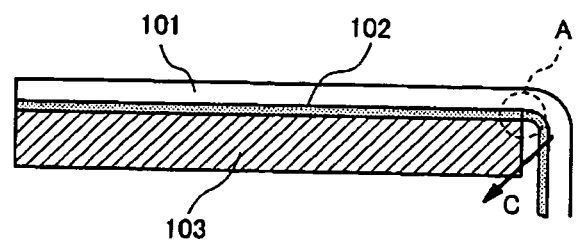
Figure 5:
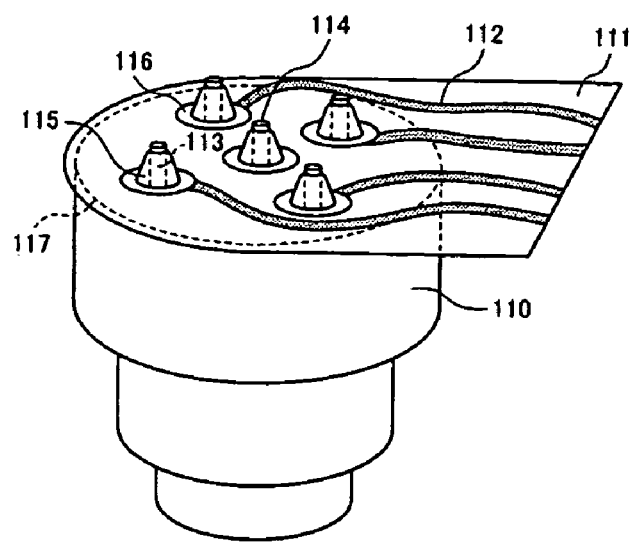
FIG. 5 shows the FPC board connected to an optical subassembly.
Figure 6:
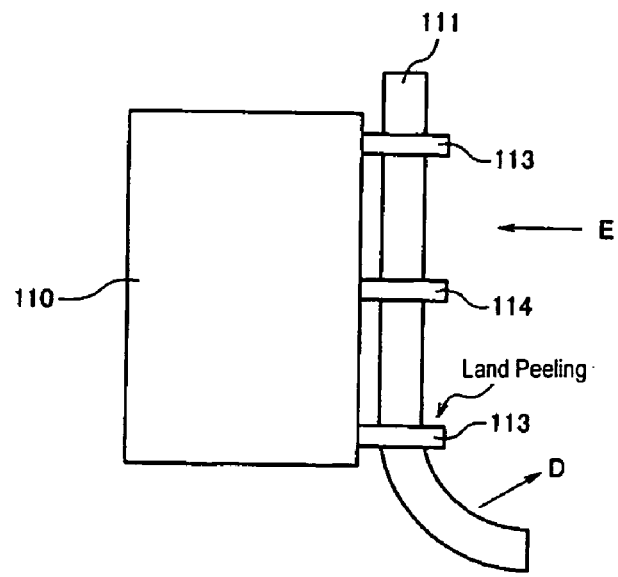
FIG. 6 is a side view of the FPC board and the optical subassembly shown in FIG. 5.
Figure 7:
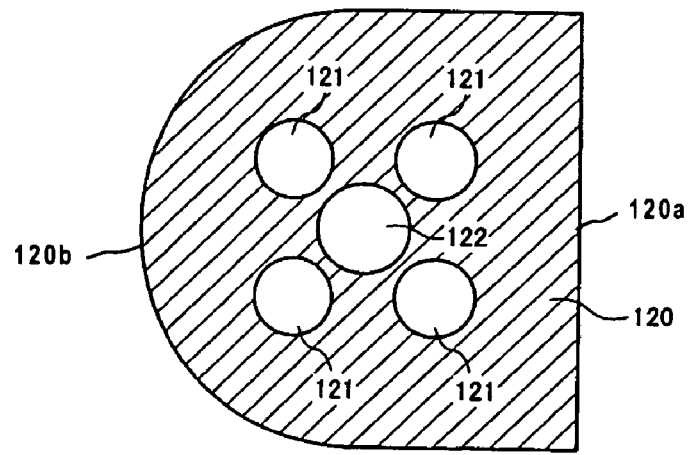
FIG. 7 shows a support board to keep the FPC board flat.

FIG. 3 shows one example of the support board 10 of the invention, which may be applicable to the optical subassembly 110 shown in FIG. 5 and FIG. 6. The support board 10 has a clipped portion 11 in one edge thereof. The board 10 also provides a plurality of via-holes, 12 and 13, positions of which correspond to via-holes provided in the FPC board 111 shown in FIG. 5. The other edge of the board 10 traces the shape of the FPC board 111.

In FIG. 5, lead pins, 113 and 114, of the optical subassembly is soldered to corresponding lands 116 of the FPC board 111 after passing the via-holes formed in the FPC board 111. In such configuration, the FPC board is often bent with a radius thereof smaller than 2 millimeter, typically from 1.0 mm to 1.5 mm. Assuming an arrangement that the wiring pattern 112 is provided on the surface not facing the optical subassembly 110, and the FPC board 111 is bent outwardly, the direction D in FIG. 6, the breakage of the wiring pattern 112 or the peel off the land may occur due to the stress affected to the bent portion of the FPC board 111.

Therefore, the support board 10 shown in FIG. 3 is stuck to the FPC board 111 from the side denoted as E. Thus, the support board 10 makes a portion of the FPC board 111 stuck with the board 10 flat. Moreover, even when the FPC board 111 is bent at the edge portion of the support board 10 with a small radius, typically from 1.0 mm to 1.5 mm, the wiring pattern 112 formed on the FPC board 111 may pass the clipped portion 11 of the support board 10. Accordingly, the edge of the support board 10 can not damage the wiring pattern 112.

Many variations and modifications may be made to the preferred embodiment of the invention without departing substantially from the spirit and principles of the invention. All such modifications and variations are intended to be included herein within the scope of the present invention, as defined by the following claims.

What is claimed is:

1. A wiring structure, comprising:
   a flexible printed circuit board having a first region and a second region, at least one surface of said flexible printed circuit board forming a wiring pattern extending from said first region to said second region, said flexible printed circuit board being bent with a preset radius at a boundary between first and second region where said wiring pattern faces inward; and
   a support board affixed to said surface on which said wiring pattern is formed at said first region of said flexible printed circuit board to support said flexible printed circuit board,
   wherein said a portion clipped from a perimeter of said support board in the vicinity of said boundary permits said wiring pattern to pass over said clipped region without contacting said support board.

2. The wiring structure according to claim 1,
   wherein said preset radius is smaller than 2 millimeters.

3. The wiring structure according to claim 1,
   wherein a width of said clipped portion of said support board is wider than a width of said wiring pattern.

4. The wiring structure according to claim 3,
   wherein said width of said clipped portion is at least three time wider than said width of said wiring pattern, and
   a gap from an edge of said wiring pattern to an edge of said clipped portion is substantially equal on both sides of said wiring pattern.

5. The wiring structure according to claim 1,
   wherein said support board is made of polyimide.

6. An optical subassembly having a plurality of lead pins connected with an electronic circuit, said optical subassembly comprising:
   a wiring structure, for connecting said plurality of lead pins to said electronic circuit, including
   a flexible printed circuit board having a first region and a second region, at least one surface of said flexible printed circuit board forms a wiring pattern extending from said first region to said second region, said flexible printed circuit board is bent with a preset radius at a boundary between first and second regions where said wiring pattern faces inward, said flexible printed circuit board having a plurality of via-holes to pass said plurality of lead pins, said via-holes surrounded by lands to be soldered with said lead pins, and
   a support board attached to said one surface of said first region of said flexible printed circuit board to support said flexible printed circuit board, said support board having a plurality of via-holes aligned with said via-holes in said flexible printed circuit board to pass said plurality of lead pins,
   wherein said support board has a portion clipped from a perimeter of said support board in the vicinity of said boundary, and
   said wiring pattern passes over said clipped portion.

7. The optical subassembly according to claim 6,
   wherein said preset radius is smaller than 2 millimeters.

8. The optical subassembly according to claim 6,
   wherein a width of said clipped region is at least three times wider than a width of said wiring pattern, and
   a gap from an edge of said wiring pattern to an edge of said clipped region is substantially equal to said width of said wiring pattern.

9. The wiring structure according to claim 6,
   wherein said support board is made of polyimide.

* * * * *